United States Patent [19]

Orban

[11] 4,208,548
[45] Jun. 17, 1980

[54] APPARATUS AND METHOD FOR PEAK-LIMITING AUDIO FREQUENCY SIGNALS

[75] Inventor: Robert A. Orban, Belmont, Calif.

[73] Assignee: Orban Associates, Inc., San Francisco, Calif.

[21] Appl. No.: 955,322

[22] Filed: Oct. 27, 1978

Related U.S. Application Data

[63] Continuation-in-part of Ser. No. 816,955, Jul. 19, 1977, abandoned.

[51] Int. Cl.² .................................. H04B 15/00
[52] U.S. Cl. ........................ 179/1 VL; 179/1 P; 328/162; 328/169
[58] Field of Search ............ 179/1 D, 1 P, 1 VL; 328/31, 162, 165, 169; 325/402, 403, 480, 482

[56] References Cited

U.S. PATENT DOCUMENTS

| | | | |
|---|---|---|---|
| 2,506,770 | 5/1950 | Braden | 328/162 |
| 3,068,418 | 12/1962 | Hajian | 328/162 |
| 3,651,339 | 3/1972 | Herrmann et al. | 328/162 |
| 3,916,293 | 10/1975 | Omori et al. | 307/237 |
| 3,991,370 | 11/1976 | Pate | 179/1 VL |
| 4,016,497 | 4/1977 | Miedema | 328/162 |
| 4,103,243 | 7/1978 | Orban | 307/237 |

Primary Examiner—James W. Moffitt
Assistant Examiner—Randall P. Myers
Attorney, Agent, or Firm—Blakely, Sokoloff, Taylor & Zafman

[57] ABSTRACT

A peak-limiting apparatus and method particularly useful in systems employing high frequency pre-emphasis to compensate for steep high frequency rolloff in a receiver, or the like. The apparatus and method is useful in standard AM broadcasting to maximize loudness without noticeable distortion. The distortion caused by a clipper is determined by subtracting a clipper's output from its input. This distortion is compared in a plurality of critical bands with the input to provide a gain control feedback signal for a variable gain stage. The psycho-acoustic phenomenon of "masking" is used to estimate maximum (non-audible) clipping.

29 Claims, 10 Drawing Figures

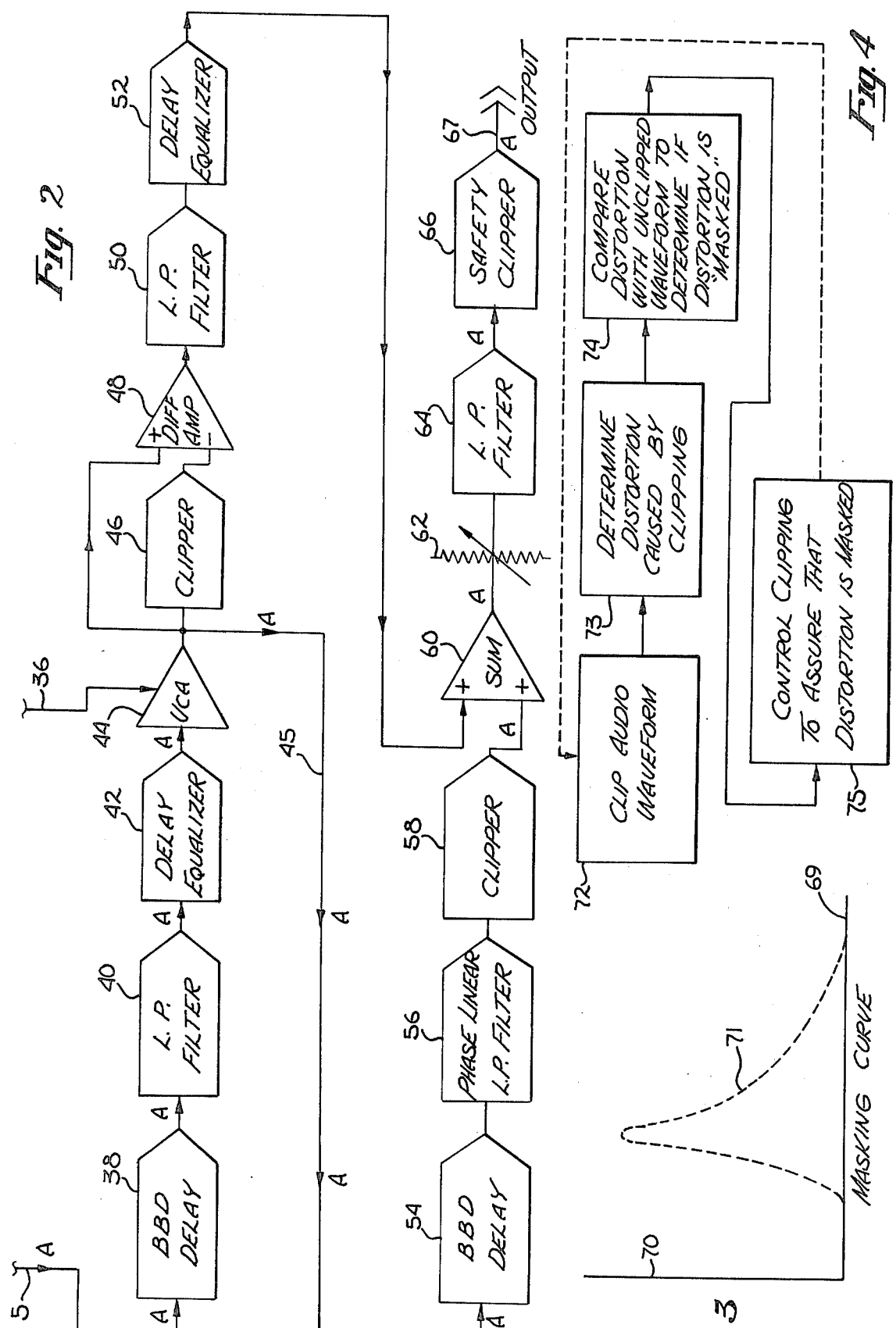

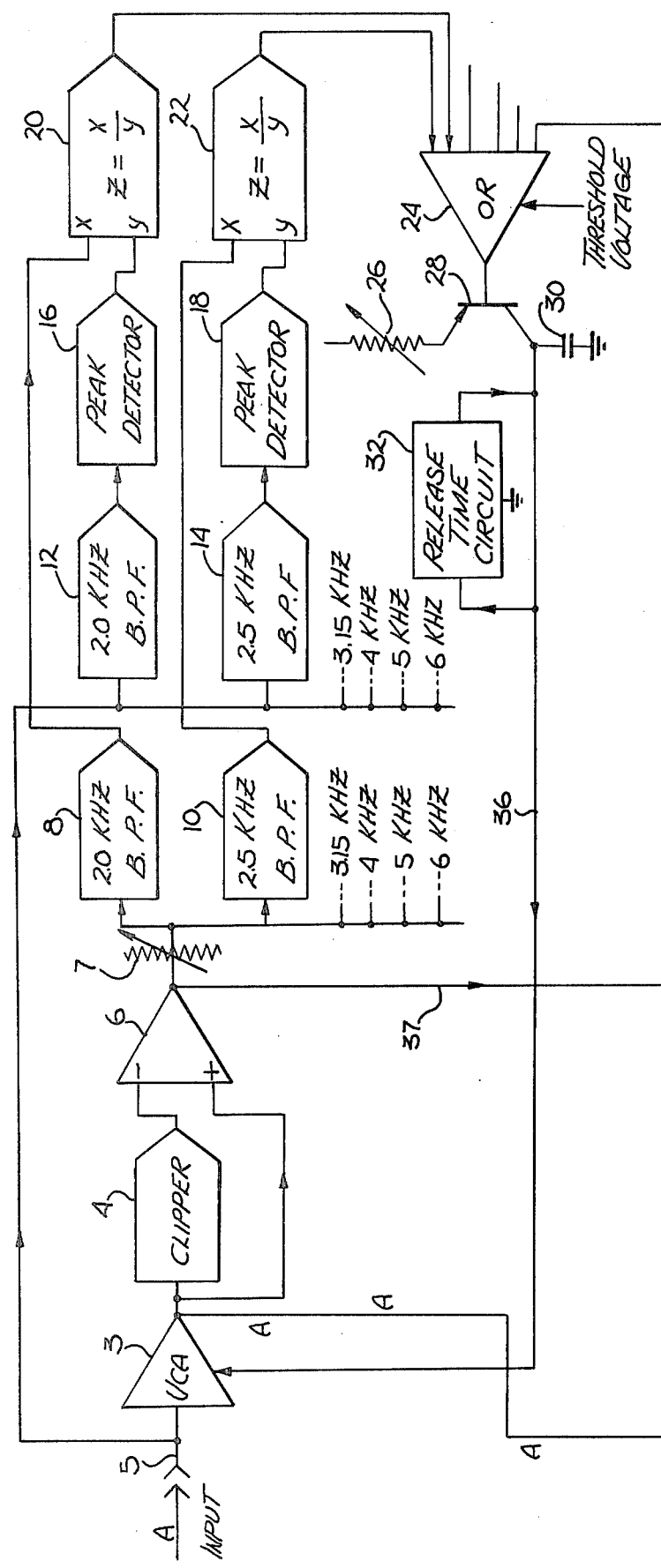
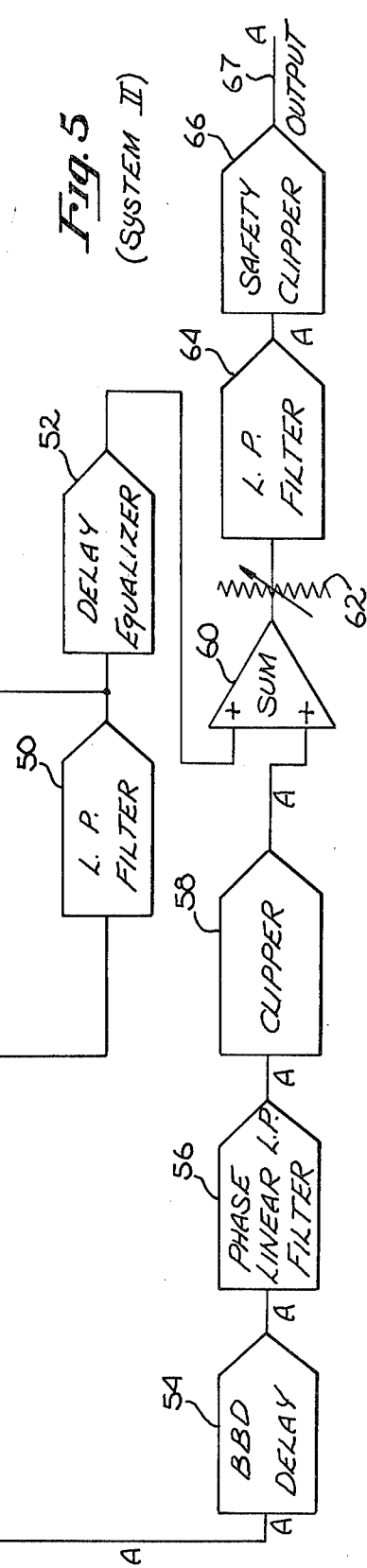
Fig. 5 (SYSTEM II)

APPARATUS AND METHOD FOR PEAK-LIMITING AUDIO FREQUENCY SIGNALS

CROSS REFERENCES TO RELATED APPLICATIONS

This is a continuation-in-part application of Ser. No. 816,955, filed July 19, 1977 now abandoned, entitled "APPARATUS AND METHOD FOR PEAK-LIMITING AUDIO FREQUENCY SIGNALS", now abandoned.

BACKGROUND OF THE INVENTION

1. Field of the Invention

The invention relates to the field of peak-limiting circuits particular for audio signals.

2. Prior Art

Numerous peak-limiting circuits, methods and systems are known for peak-limiting audio signals. The peak levels of such signals must be controlled in systems characterized by a sudden overload point which may not be exceeded for satisfactory operation. Among such systems are AM broadcasting, FM broadcasting, optical film recording by the "variable area" method, carrier telephony, and disc recording. The present invention is especially useful for systems characterized by a steep high frequency rolloff in a receiver or other device and where high frequency pre-emphasis is used to compensate for this rolloff, such as in AM broadcasting.

One system for controlling peak levels in AM broadcasting employs a variable gain amplifier, or like element, in the audio path. This amplifier is controlled by a level detector which typically includes some form of integration at its output. For audio signals, the attack time for this system is in the range of ten microseconds with a recovery time of a few hundred milliseconds. Unnatural volume reductions often occur with this sytem because microsecond-wide peaks can cause gain reductions for hundreds of milliseconds.

Another prior art peak control means employs clipping; diode clippers are used to instantaneously clip the waveform. The amount of such clipping is usually quite small (2 to 5 db) to prevent noticeable non-linear distortion.

A variable gain amplifier in combination with a clipper is also used for controlling peak levels of audio signals for AM broadcasting. In this system, the attack time of the variable gain amplifier loop is slower than the attack time for such amplifiers when used without a clipper. These slower attack times can result in audible distortion when clipping does occur. The attack time in these systems must be fast enough to prevent noticeable clipping distortion for the "worse case" program material, thus this system cannot be optimized for maximum loudness.

The prior art systems all lack information concerning the amount of distortion perceived by a listener. The action of these systems is conservative in order not to introduce noticeable distortion. For this reason loudness is not maximized for many types of program material.

As will be seen, the presently described apparatus and method permits maximum possible loudness from a peak-level limited channel at all times by clipping the signal as much as possible without adding noticeable distortion. This method is particularly effective with systems employing large amounts of high frequency pre-emphasis. The level of noticeable audio distortion is estimated based on known psychoacoustic masking and this estimate is used in a feedback loop to control the signal level applied to a clipper.

SUMMARY OF THE INVENTION

A peak-limiting apparatus and method are described which is particularly useful for systems characterized by a steep high frequency rolloff in a receiver and which employ high frequency pre-emphasis. In one embodiment, the apparatus for controlling the peak levels of an audio signal includes a variable gain amplifier which is used to control the gain of the input audio signal in response to a control signal. A clipper is coupled to the output of this variable gain amplifier. The distortion introduced by the clipper is determined by differencing the input and output signals to this clipper. The input signal is coupled to a plurality of filters each covering a different critical band; these bandpass filters approximate psychoacoustic masking curves. The distortion signal is coupled to second plurality of ordinary bandpass filters each covering the same critical bands. The outputs of the filters for each band are compared and a feedback control signal is developed for the variable gain amplifier.

BRIEF DESCRIPTION OF THE DRAWINGS

FIGS. 1 and 2, combined, are an electrical schematic and block diagram of the presently preferred embodiment of the invented apparatus.

FIG. 3 is a graph used to illustrate psychoacoustic masking.

FIG. 4 illustrates the series of steps by which the peak-limiting of the present invention is accomplished.

FIG. 5 is an electrical schematic and block diagram of an alternate embodiment of the present invention.

DETAILED DESCRIPTION OF THE INVENTION

An apparatus and method for peak-limiting audio frequency signals are described. In the following description of the presently preferred embodiment, numerous specific details are described such as specific frequencies, time constants, etc. It will be obvious to one skilled in the art that the described invention may be employed without using these specific details. In other instances, well-known circuits have not been described in detail in order not to obscure the invention in unnecessary details. Since the presently preferred embodiment of the invention is employed as part of an AM broadcasting system, the following description is oriented towards that use. However, it will be obvious to one skilled in the art that the invention may be employed in other applications such as FM broadcasting, optical film recording by the "variable area" method, carrier telephony, and disc recording. The presently preferred embodiment of the invention is incorporated in a commercial AM system, the Optimod-AM Model 9000A, manufactured by Orban Associates, Inc. of San Francisco, California.

Figure 1:
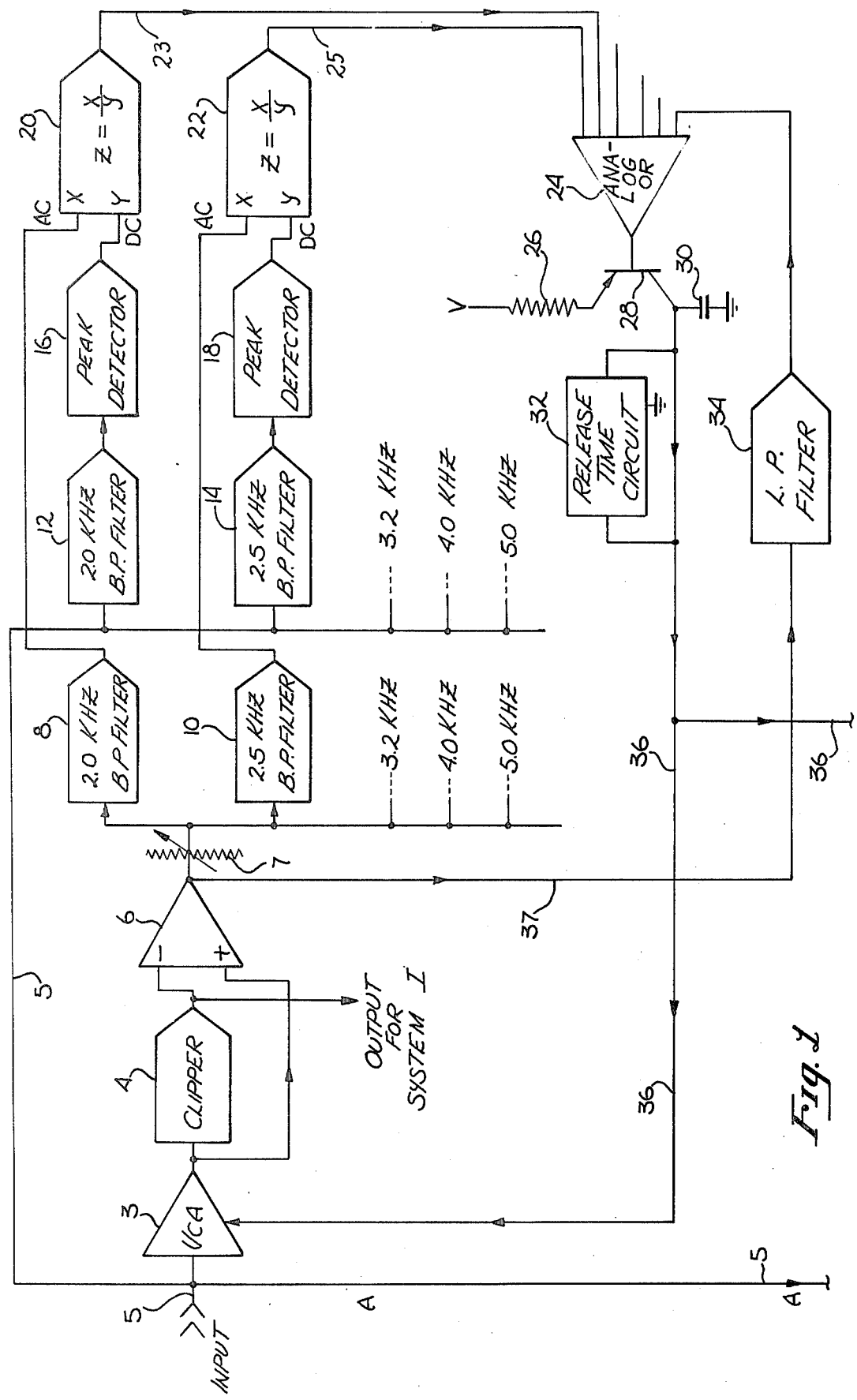

For FIGS. 1 and 2, an input audio signal is applied to line 5 and a peak-limited audio output signal is provided on line 67. The output on line 67 may be used to amplitude-modulate a carrier in an ordinary manner. In a typical AM broadcasting system, signal processing occurs before the signal is coupled to line 5. This processing is well-known in the art and typically consists of bandlimiting, compression, and equalization to compensate for receiver deficiencies. This equalization varies widely, as it is adjusted to the taste of the station, rather than to a standard. Often a multi-band compressor where each band has a separate automatic gain control is employed in place of, or in addition to, the single-band compressor. Since in AM broadcasting, the frequency response of the reciver falls-off sharply beyond approximately 1.5–2.0 kHz, the equalization is often adjusted to provide substantial high frequency pre-emphasis. This pre-emphasis is substantially more than the 6 db per octave (75 microseconds) required by FM systems and can be as much as 20 to 30 db at 5 kHz, starting at 12 db per octave and breaking to 18 db per octave if full compensation for receiver high frequency rolloff is desired.

In the present invention the response of the human ear is estimated and this estimate used to determine esthetically acceptable distortion levels; this distortion is introduced by clipping the audio signal. In FIG. 3 a psychoacoustic masking curve is shown for a 1 kHz tone. The abscissa 69 represents the subjective pitch. The ordinate 70 represents the loudness density in the rate of change of sones per unit of subjective pitch. Those tones such as 1.1 kHz tone which fall under the tail 71 of the curve are "masked" by the 1.0 kHz tone, that is, they are not discernible by the human ear. The curve of FIG. 3 in a plurality of critical frequency bands is approximated by bandpass filters (filters 12 and 14) and employed, as will be described, to establish tolerable (non-audible) clipping levels. For a thorough discussion of masking, see "The Auditory Masking of One Pure Tone by Another and Its Probable Relation to the Dynamics of the Inner Ear", *Physical Review* 23, page 266 (1924), R. L. Wegel and C. E. Lane; "On the Masking Pattern of a Simple Auditory Stimulus", *Journal of the Acoustical Society of America* 22, page 622 (1950), J. P. Egan and H. W. Hake; and *Speech and Hearing in Communications* by Harvey Fletcher, Van Nostrand, 1953.

Referring briefly to FIG. 4, the method of the present invention is illustrated. First, an audio signal is clipped as is shown by block 72. Next, the distortion (that is, the part of the signal which is eliminated) introduced by the clipping is determined (block 73). A differencing means such as differential amplifier 6 of FIG. 1 is employed for this purpose. Then the distortion is compared with the unclipped audio signal to determine if the clipping causes noticeable distortion (block 74). Essentially, the distortion is examined to determine if it is psychoacoustically masked. As shown by block 75, the amount of clipping is controlled to keep the resulting distortion unnoticed. In the apparatus of FIG. 1 this is performed with a feedback loop and a variable gain amplifier.

Figure 8:
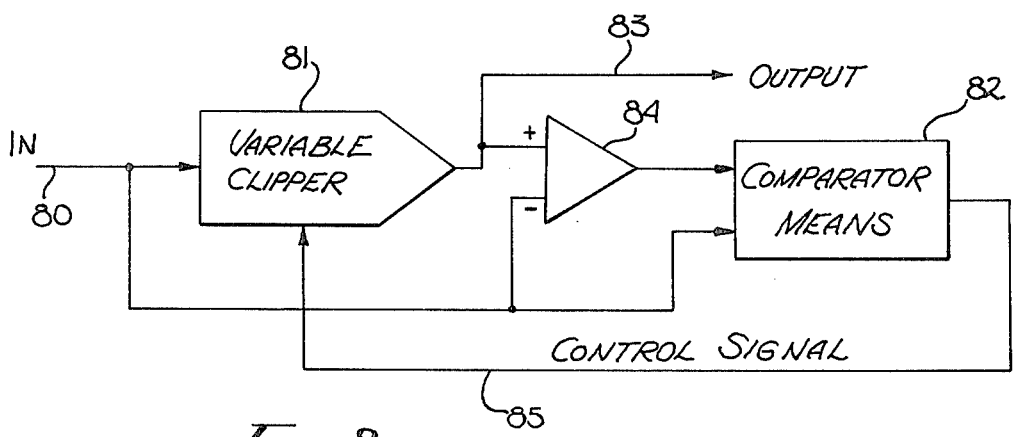
FIG. 8 is a general block diagram used to illustrate one aspect of the invention.

Before describing the presently preferred embodiment of the invention, the overall principle of the present invention may be more readily understood from the simplified block diagram of FIG. 8. In FIG. 8 the input audio signal on line 80 is coupled to a variable clipper 81. The clipper 81 has a variable threshold which is controlled by a control signal applied to the clipper 81 on line 85. Thus, the level or threshold of clipper 81 may be varied and the amount of clipping of the audio signal is likewise varied.

The output of the clipper 81 is differenced with the input audio signal on line 80 in the differencing amplifier 84. The output of the amplifier 84 is the distortion. This signal is the signal which is normally discarded and resembles a center clipped waveform. (Note the distortion should be distinguished from the distorted audio signal or output signal on line 83). In the present invention the distortion from the amplifier 84 is compared with the input audio signal in the comparator means or signal processing means 82 to generate a control signal on line 85. As described elsewhere in this application the comparator means 82 takes advantage of the psychacoustic phenomena of masking to determine the maximum allowable non-audible clipping.

When the audio signal on line 80 of FIG. 8 is below the threshold of the clipper 81, no clipping occurs and the signal on line 83 is the same as the signal on line 80. For this condition, the signal applied to both input terminals of the amplifier 84 is the same and no output signal is coupled to the comparator means 82 from the amplifier 84. When the signal on line 80 increases in magnitude and exceeds the clipping threshold of clipper 81 a clipped waveform is present on line 83 and a signal representing the distortion is coupled to the comparator means 82. When the comparator means 82 determines that the amount of clipping is audible or near audible on the control signal on line 85 raises the threshold of the clipper 81 thereby reducing the amount of clipping. For the circuit of FIG. 8, the amplitude of the output signal on line 83 will not have a maximum predetermined magnitude. For AM broadcasting and many other applications the output audio signal must not exceed a predetermined magnitude and thus ideally the signal on line 83 must be limited to some predetermined maximum level.

Referring briefly now to FIG. 1, in the presently preferred embodiment, the audio signal is first applied to a voltage controlled amplifier (VCA) 3 before being coupled to a clipper 4. The analagous signal to the control signal on line 85 of FIG. 8 is a control signal on line 36 which is coupled to the VCA 3. The VCA 3 controls the amounts of clipping. Even though the clipper 4 has a fixed level of clipping, by increasing and decreasing the amplitude of the input audio signal the amount of clipping introduced by clipper 4 is in fact varied. Thus in the presently preferred embodiment the VCA 3 and clipper 4 constitute a clipping means performing an analogous function to the variable clipper 81 of FIG. 8.

FIGS. 1 and 2 illustrate the invention in its presently preferred embodiment and include numerous circuits not required to perform the basic functions set forth in FIG. 4 (FIGS. 1 and 2 combined are referred to hereinafter as System III). As will be described in greater detail, the circuit of FIG. 1 may be employed alone without the circuit of FIG. 2 where an output audio signal is obtained at the output of clipper 4 (hereinafter this embodiment is referred to as System I). FIG. 5 includes substantially all the circuits of FIG. 1 and a portion of the circuits of FIG. 2; this embodiment is identified hereinafter as System II. Before discussing the operation of Systems I, II and III, however, each of the components, devices and blocks of FIGS. 1 and 2 will be specifically identified along with their coupling in the system. It will be apparent to one skilled in the art that each of these components, device, and blocks may be realized with commercially available hardware or may be fabricated employing well-known circuit design techniques.

The input audio signal to the apparatus of FIGS. 1 and 2 is applied to line 5. The main path of the audio signal is indicated by the letter "A" adjacent to the path. This path proceeds from line 5 to the BBD delay means 38 of FIG. 2. The circuit of FIG. 1 operates as a subsystem or pilot system for System III. The audio path in FIG. 2 includes lowpass filter 40, delay equalizer 42, VCA 44 and then continues via line 45 through the BBD delay means 54, lowpass filter 56, clipper 58, amplifier 60, lowpass filter 64 and finally through the safety clipper 60 to the output line 67.

The input signal on line 5 in addition to being coupled to the BBD delay means 38 is coupled to a variable gain amplifier, more specifically, a voltage-controlled amplifier, VCA3. Line 5 is also coupled to a plurality of bandpass filters 12, 14, as will be discussed. The output of VCA 3 is coupled to the input of a clipper 4 and to the positive input terminal of a differential amplifier 6. The clipper 4 which may be an ordinary diode clipper has its output coupled to the negative terminal of the differential amplifier 6. The output of the differential amplifier 6 is coupled to a plurality of bandpass filters 8 and 10, through a pad or variable resistor 7. The output of this amplifier is also coupled via line 37 to the input of a lowpass filter 34.

(The pad 7 is not required and in fact does not exist. While a fixed coupling (not variable) may be employed in the presently preferred embodiment this coupling is, in effect, varied by complex circuit means disclosed in copending application, Ser. No. 858,720, filed Dec. 8, 1977, entitled "Peak-Limiting Apparatus for Audio Signal", assigned to the assignee of this application, now abandoned.)

The bandpass filters 12 and 14 each approximate the masking curve of FIG. 3 in a critical band. In the presently preferred embodiment, the bands are spaced at ⅓ octave over most of the audible range. While only filters 12 and 14 are illustrated, as indicated by the dotted lines, additional filters centered at 3.2 kHz, 4.0 kHz, 5 kHz, etc., are employed in the presently preferred embodiment. (For System I filters in critical bands below 2.0 kHz are also used). In duplicating the curve of FIG. 3, subjective pitch is converted to a logarithmic frequency scale and loudness density to a logarithmic intensity scale. Filters with characteristics approximating these masking curves may be fabricated using well-known circuit design techniques such as set forth in *Approximation Methods for Electronic Filter Design*, Richard W. Daniels, McGraw Hill Book Company, 1974. In a less precise system, fewer masking filters may be employed where each has a wider bandwidth (e.g. one octave), or the entire audible frequency range need not be covered as a means of reducing cost.

The bandpass filters 8 and 10 have the same center frequency as filters 12 and 14, respectively. These filters have a shape which is ⅓ octave, thus the tail 71 of FIG. 3 is not approximated by these filters. Filters are also employed to cover the critical bands at 3.2 kHz, 4.0 kHz, 5.0 kHz, etc. in System III.

In the currently realized commerical embodiment filters 8 and 10 etc. are identical to filters 12, 14, etc. (respectively) as a means of reducing cost. Thus the masking curves are approximated by ordinary bandpass filters.

The output of filter 12 is coupled to a peak detector 16 and similarly the output of filter 14 is coupled to a peak detector 18. The peak levels detected by detectors 16 and 18 are coupled to the Y-terminals of dividers 20 and 22, respectively. Note that the output of these detectors are DC signals. The output of filters 8 and 10 are coupled to the X-terminals of dividers 20 and 22, respectively. These outputs are AC signals as indicated in the drawing. The outputs of the other filters (not illustrated) are coupled in an identical manner to other dividers. In the presently preferred embodiment, the peak detectors 16 and 18 have an attack time of approximately 1 millisecond and a decay time of approximately 25 milliseconds. To assure stability in the system, the attack time of these peak detectors should be substantially faster than the attack time associated with the integration function performed by capacitor 30.

Each of the dividers 20 and 22 are two quadrant analog dividers which perform the division indicated, that is, $Z=X/Y$. The "Z" output from these dividers are coupled to the input terminals of an analog ORing circuit 24. This circuit has an adjustable threshold level and provides an output when any of the input signals exceed this threshold level. The signal paths associated with the other critical bands such as 3.2 kHz, 4.0 kHz, 5.0 kHz, etc., are likewise coupled through dividers to the other input terminals of the ORing circuit 24 shown in detail in FIG. 6. The output of the 1.8 kHz lowpass filter 34 also provides an input to circuit 24 for Systems II and III.

Figure 7:
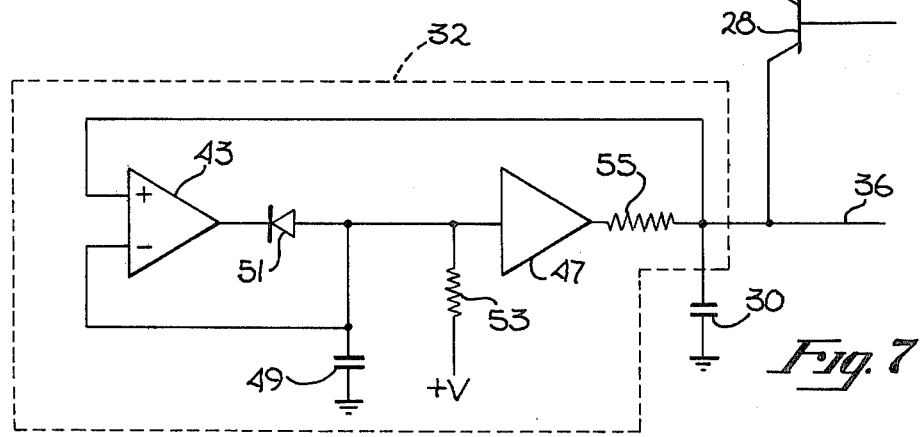
FIG. 7 is an electrical schematic of the presently preferred embodiment of the release time circuit used in the circuit of FIG. 1.

Integration is performed through the circuit which comprises a resistor 26, transistor 28, and the capacitor 30. The resistor 26 is coupled between a source of potential and the emitter of transistor 28. The output of circuit 24 is coupled to the base of this transistor. A control signal is developed at the collector of this transistor (line 36); this node is coupled to capacitor 30. A release time circuit 32 and the control terminals of VCAs 3 and 44 (FIG. 2) are coupled to line 36. The release time circuit 32 and integration are also shown in FIG. 7.

Referring now to FIG. 2, a 3.7 millisecond delay of the audio signal is provided by the bucket-brigade device, BBD delay means 38. In the presently preferred embodiment, a 512 stage, MOS integrated circuit, BBD is employed. This circuit is included in a common package with the 512 stages of the BBD delay means 54. A 500 microsecond delay is provided by the BBD delay means 54 by clocking this circuit with a 500 kHz signal. This clocking signal is divided by 8 and used to clock the BBD delay means 38.

The output of delay means 38 is coupled to the input of a lowpass filter 40. The output of filter 40 is coupled to the input of an allpass delay equalizer 42. The output of equalizer 42 is coupled to the input of a VCA 44; VCA 44 may be identical to VCA 2. The output of VCA 44 is coupled to the input of a clipper 46, to the positive terminal of differential amplifier 48, and to the input of the delay means 54 via line 45.

Low frequency compensation is provided, as will be explained, through the path comprising clipper 46, differential amplifier 48, lowpass filter 50, and the allpass delay equalizer 52. The output of the clipper 46 is coupled to the negative input terminal of the differential amplifier 48. The output of this amplifier is coupled through the 1.8 kHz lowpass filter 50 to the equalizer 52. The output of equalizer 52 is coupled to one input terminal of a summing amplifier 60.

The output of BBD delay means 54 is coupled through a phase linear lowpass filter 56 to a clipper 58. The output of this clipper is coupled to the other input terminal of the summing amplifier 60. The output of summing amplifier 60 is coupled through a variable resistor 62 to the input of a lowpass filter 64. The output of this filter is coupled to a safety clipper 66 and its output, line 67, provides the output from the apparatus.

As previously mentioned in System I, the circuit shown in FIG. 1 is employed without the circuit of FIG. 2 as a peak-limiting circuit. Line 37 and filter 34 are not used in System I. Moreover for System I filters (such as filters 8 and 12) covering critical bands below 2.0 kHz are used. The output signal for System I is taken at the output of the clipper 4.

The input audio signal on line 5 after being coupled through the VCA 3 is applied to the clipper 4. The input and output of clipper 4 is differenced within the differential amplifier 6. Thus the output of this differential amplifier provides a "distortion" signal which represents the distortion introduced by the clipper 4. (It is assumed that no audible distortion is introduced by VCA 3). This distortion signal is coupled through the variable attenuator 7 to allow an operator to set the amount of perceived distortion. This signal is then passed through the plurality of bandpass filters 8 and 10. The unprocessed and unclipped input audio signal is applied to the filters 12 and 14, which filters duplicate the masking curve of FIG. 3 (or for a less sophisticated system filter 12 and 14 may be identical to filter 8 and 10, respectively). Thus the unprocessed, input audio signal and the distortion signal are filtered into critical bands.

The system now determines whether the distortion in each of these bands will be masked by the non-distorted signals in that band. If the distortion is not adequately masked, the gain of VCA 3 is decreased by the signal on line 36 (thereby reducing the amount of clipping) until adequate masking is obtained. The peak detectors and the dividers along with the ORing circuit perform a comparison or evaluation function and compare the unprocessed audio signal with the distortion signal to determine if the distortion signal will be masked. In effect, this comparison or evaluation determines if the distortion is hidden under the masking curve of FIG. 3. For this reason the filters 12 and 14 filter the unprocessed audio signal in filters resembling the masking curve. These filters determine the extent of permissible distortion on an instantaneous basis.

The output of the ORing circuit provides a negative going signal whenever any of the inputs exceeds a predetermined threshold voltage. The output of circuit 24 represents a rectified "center clipped" signal when compared to its input signals. The gain of circuit 24 above threshold is relatively low. This low gain is employed to assure system stability. The output voltage of ORing circuit 24 is converted into a current signal by the transistor 28, which current signal is integrated by capacitor 30. Transistor 28 along with resistor 26 and capacitor 30 determine both the attack time for the system and the loop gain. In the presently preferred embodiment, attack times of approximately 2 milliseconds are obtained in a stable system. The system stability is primarily limited by the delays associated with the filters 8, 10, 12 and 14, and these delays necessitate the relatively long attack time. As will be described later, compensation is provided for this relatively long attack time in System III by delay means 38.

The release time for this loop is determined by the release time circuit 32. This release time is a function of the history of the required gain reduction in the presently preferred embodiment. If a large change in gain occurs, the release time is speeded up. Then following this speed up, the release time circuit 32 recovers to a much slower release time. This characteristic of the circuit 32 makes the gain changes produced by VCA 44 less audible than would an exponential release characteristic. Moreover, the circuit 32 holds the voltage on line 36 constant for approximately 10 milliseconds after any increase in gain reduction has occurred, that is, the release is delayed 10 milliseconds, not the attack. This latter feature eliminates high frequency ripple of the signal on line 36 which would otherwise modulate the audio signal.

In a more simplified version of System I, if it is assumed that the average levels of the input audio signal on line 5 are held relatively constant by compression means employed prior to the application of the signal to line 5, a control signal may be developed directly for the outputs of filters 8 and 10, or in a more simplified version, from the output of the differential amplifier 6.

In summary for System I, the feedback control signal provided on line 36 adjusts the gain of VCA 3 so as to permit the maximum amount of non-audible clipping. This, in turn, in an AM broadcasting system provides maximum loudness. This is possible since System I, unlike prior art systems, includes information concerning the amount of distortion which will be perceived by a listener.

Figure 6:
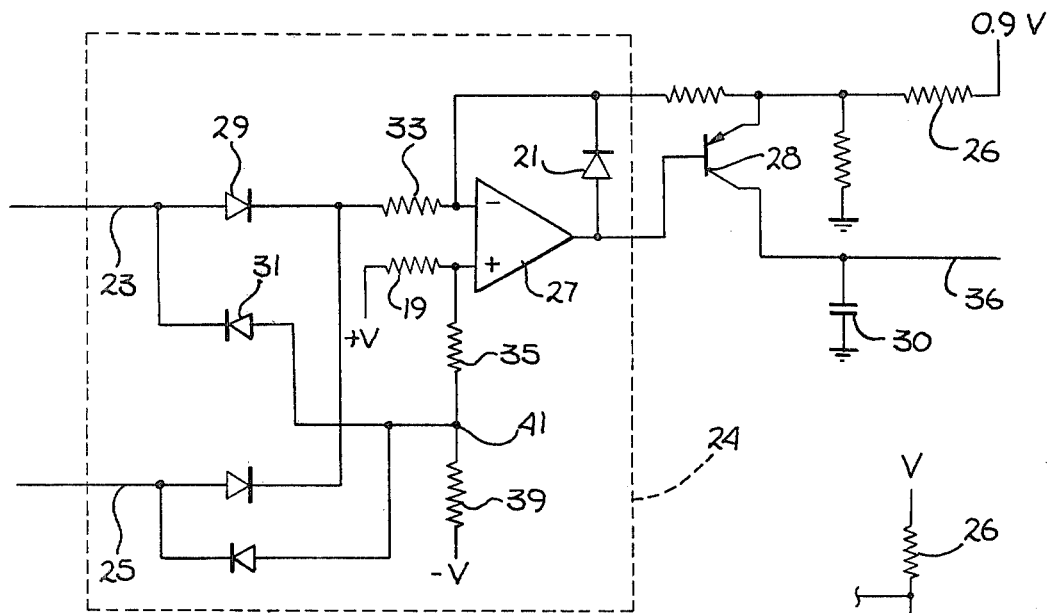
FIG. 6 is an electrical schematic of the presently preferred embodiment of the analog ORing circuit of FIG. 1.

In FIG. 6, the analog ORing circuit 24 includes an operational amplifier 27 coupled to the outputs of the dividers (lines 23 and 25) through a plurality of diodes. The node 41 is held at approximately −1 volt through the resistors 39, 35 and 19. The positive terminal of the amplifier 27 is held at approximately +1 volt by these same resistors. Feedback to the negative terminal of the amplifier 27 is provided from the output of the amplifier through diode 21 when transistor 28 is not conducting and through this transistor when it conducts. Under quiescent conditions the output of amplifier 27 is approximately 1.6 volts which reverse biases transistor 28 and keeps it from conducting. (The resistor 26 is coupled to a power supply of 0.9 volts.) When the signal on lines 23 or 25 exceeds the threshold of the input diodes, this quiescent condition is disturbed. For example, if the signal on line 23 exceeds the threshold of either diode 29 or 31, the output of the operational amplifier is driven more negatively, causing the transistor 28 to conduct. Thus, when the signal on lines 23 or 25, or the other lines, exceeds the threshold established by the diodes, the associated diode conducts causing an output signal from operational amplifier 27. This output signal causes current to flow through the transistor 28, which current is integrated on the capacitor 30. Therefore, the operational amplifier 27 performs an ORing function in the analog sense by providing an output when the signal from one or more of the dividers exceeds a predetermined threshold.

In FIG. 7 the presently preferred release time circuit 32 of FIG. 1 is generally shown. The line 36 is coupled to one input terminal of an operational amplifier 43. The output of this amplifier is coupled through a diode 51 to the input terminal of an amplifier 47. The output of amplifier 47 is coupled through resistor 55 to line 36. The input terminal of the amplifier 47 is coupled to a positive potential through resistor 53, to ground through capacitor 49 and to the other input terminal of operational amplifier 43. The amplifier 47 has a gain of less than one to prevent instability in the circuit. The release time is primarily determined by the degree to which capacitor 49 has discharged through resistor 53, and is thus constantly varied. The release time characteristics includes two separate segments which result from the use of the diode 51.

As mentioned, in typical AM broadcasting a great deal of high frequency pre-emphasis is employed to compensate for the sharp rolloff in AM receivers. Because of this pre-emphasis and also because clipping introduces large amounts of harmonic distortion, the spectrum of the clipper-induced distortion is weighted heavily towards high frequencies. On the other hand, the perceived distortion at the receiver is predominantly low frequency distortion since the sharp, high frequency rolloff characteristics of receivers filter out high frequency components. It is possible to remove the low frequency components of the clipper-induced distortion. This removal usually has only a minor effect on the overall energy in the total clipper-induced distortion components and thus has a relatively small effect on the peak level of the audio output signal.

Figure 9:
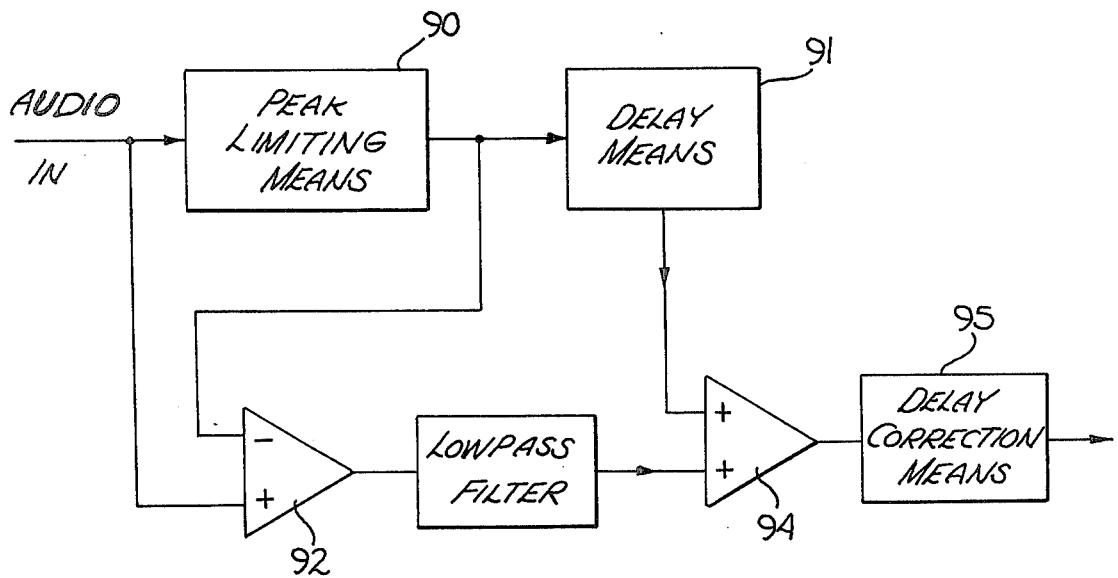
FIG. 9 is a general block diagram of the low frequency distortion cancelling means employed with the present invention.

The principle for removing the low frequency components of distortion employed in the presently disclosed apparatus is best understood from the simplified block diagram of FIG. 9. Assume that the input audio signal is applied to a peak-limiting means 90 or other means which causes distortion. The peak-limiting means may be a clipper, voltage controlled amplifier or other non-linear circuit. It is assumed that the peak-limiting means or other distortion-causing means has substantially no time delay, i.e., its output is wholly independent of the previous history of the signal applied to its input and depends only upon the instantaneous transfer (input-output) curve of the peak-limiting means. In general, this transfer curve may be time-varied by an external control voltage.

The distortion caused by the peak-limiting means is determined by the differential amplifier 92 by differencing the output of the peak-limiting means 90 with its input. This distortion is coupled to the lowpass filter 93 in order to pass the low frequency components of this distortion to the summing amplifier 94. (Note that a band-pass or other filter may be employed where, for example, the distortion in a predetermined band is to be removed.) The peak-limited signal at the output of the peak-limiting means 90 is coupled through a delay means 91 to the other input terminal of the amplifier 94. As will be explained, the delay means 91 assures that the signal at the output of the delay means 91 has the same delay as the signal at the output of the lowpass filter 93 in the pass band of this filter. The low frequency distortion is removed from the peak-limited signal at the amplifier 94. The resultant signal may require delay correction by delay correction means 95. Generally, this delay correction is required if the delay means 91 does not provide a uniform delay across the pass band of the entire transmission system. The non-uniform phase delay causes time domain distortion which changes the peak levels and thus, to some extent, destroys the effectiveness of the peak-limiting means 90. If the lowpass filter 93 provides a constant delay over the band and delay means 91 provides the same delay, then there is no need for the delay correction means 95 such as in the embodiment of FIGS. 2 and 5 described below.

If the lowpass filter 93 is a minimum phase filter, which filters are generally more economical, the delay means 91 may be an allpass network. The delay correction means 95 may be an allpass network, which phase linearizes the delay caused by delay means 91.

In another example, assume that the lowpass filter 93 is again a minimum phase filter. The delay required from delay means 91 may be in part obtained from other system components such as other lowpass filters employed in the system. Where a lowpass filter is employed for band-limiting the output signal (such as filter 64 of FIG. 5) it may be used to provide the delay of delay means 91, alone or in conjunction with an allpass network. In this case, the delay correction means 95 again may be an allpass network to assure a constant delay.

In still another example, a somewhat more economic system is obtained where the delay means 91 is, for example, the lowpass filter employed to band-limit the output signal (system filter). This filter is cascaded with an allpass network such that the overall delay of the filter plus the allpass network is approximately constant within the system lowpass filter's passband. The lowpass filter 93 has a relatively gradual rolloff since this provides an approximation to constant delay without the need for a phase corrector. A first shelving filter with a pole and zero which approximates the rolloff characteristics of the lowpass filter 93 at its cutoff frequency may be employed along with the system filter. Then the delay correction means 95 may be a second (complementary) shelving filter which rises instead of falls. (The second shelving filter would have a pole at the location of the zero of the first filter and a zero at the location of the pole of the first filter.) These two shelving filters assure uniform magnitude response.

Figure 10:
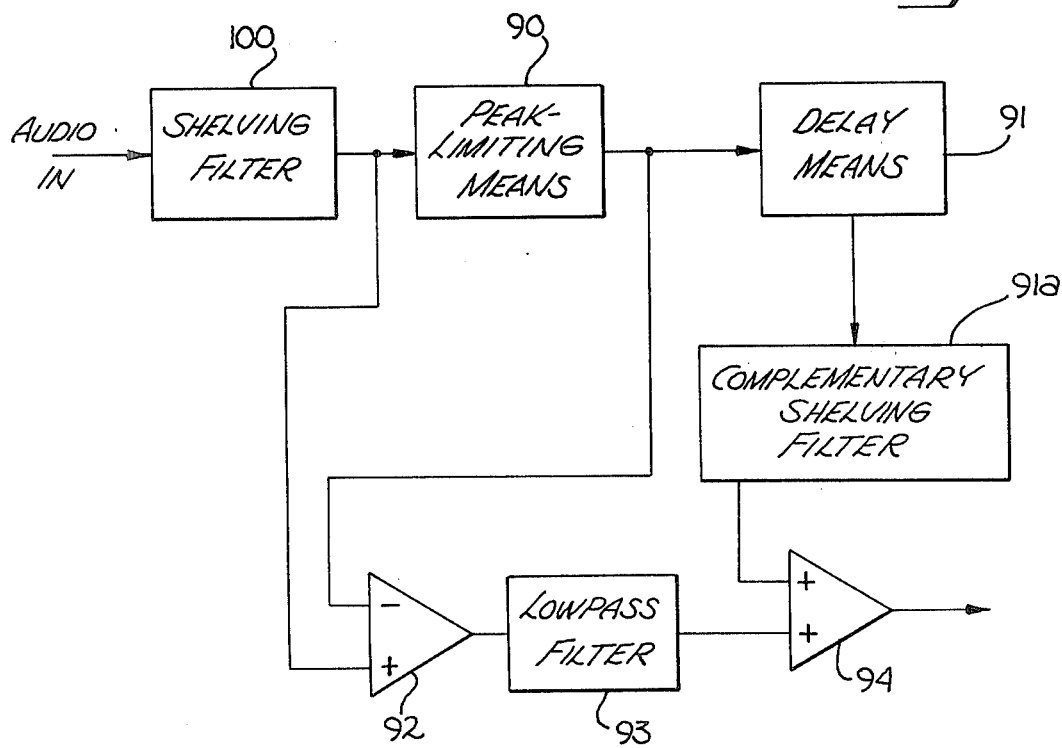
FIG. 10 is an alternate embodiment of the low frequency distortion cancelling means of FIG. 9.

The shelving filter employed in lieu of the delay correction means 95 may be even coupled before the peak-limiting means 90 (FIG. 10) and in such cases provides over-shoot protection. The use of a shelving filter for this protection is discussed in U.S. Pat. No. 4,103,243. In FIG. 10, the shelving filter 100 is shown coupled to receive the input audio signal. The remainder of the circuit of FIG. 10 is similar to the circuit of FIG. 9, and like components have been numbered with the same numbers. The output of shelving filter 100 is coupled to the peak-limiting means 90. The distortion is determined in the same manner as in the circuit of FIG. 9 through amplifier 92. The low frequency distortion is passed through the filter 93 to the summing network 94. The output of delay means 91 is coupled to the complementary shelving filter 91a, which filter has the complementary characteristics of the shelving filter 100. The specific characteristics of the shelving filter 100, which are currently preferred, are the "pre-emphasis" characteristics described for the shelving filter 36 of FIG. 1 described in U.S. Pat. No. 4,103,243.

System II shown in FIG. 5, which includes all the circuitry shown in FIG. 1 and a portion of the circuitry shown in FIG. 2, removes the low frequency components of the clipper-induced distortion from the output. This is accomplished by coupling the output of VCA 3 to the BBD delay means 54 and by coupling the output of the differential amplifier 6 to the lowpass filter 50. (In FIG. 5 the same numbers are used to identify like circuits and blocks of FIGS. 1 and 2.)

In System II, in order to remove the low frequency distortion from the system output, line 67, the output of the differential amplifier 6, line 37, is coupled to the lowpass filter 50. This filter's output as will be described in more detail, is subtracted from the clipped waveform in amplifier 60. Filter 50 in the presently preferred embodiment, is a third order Chebychev approximation with a 0.18db bandpass ripple. This provides at least 40db cancellation in amplitude ignoring for a moment phase shifting. The delay equalizer 52 is a single, second order allpass section. In conjunction with filter 50, it provides a lowpass filtering means with a linear phase characteristic of ±0.15° from 0 to 1.8 kHz. Thus the combination of filters 50 and 52 provides a constant delay of approximately 500 microseconds to 1.8 kHz.

In order to cancel the low frequency distortion, a delay of approximately 500 microseconds must also be provided in the audio signal path. This delay, in the presently preferred embodiment, is provided by a bucket-brigade device, BBD delay means 54. (This means provides the delay of delay means 91 of FIG. 9.) The audio signal applied to the input of BBD delay means 54 is delayed in the 512 stages of this device by approximately 500 microseconds since this device is clocked at a frequency of approximately 500 kHz.

The output from the BBD delay means 54 is coupled to the phase linear, lowpass filter 56 to remove the high frequency clocking signal and upper sidebands. This filter may be an ordinary third-order, Bessel lowpass filter which preserves the constant time delay obtained by the BBD delay means 54.

The output of the phase linear filter 56 is coupled to the input of a clipper 58. This clipper is identical to the clipper 4. The low frequency distortion signal from equalizer 52 is then subtracted from the output of the clipper 58 within the summing amplifier 60. (Summing is required within amplifier 60 since the output of clipper 4 is coupled to the negative terminal of differential amplifier 6.) Thus, the output of the amplifier 60 includes the desired clipped waveform, however with the more perceivable low frequency components of the clipper-induced distortion removed.

Note that in the embodiments of FIGS. 2 and 5, the undistorted (unclipped) waveform is coupled to the delay means, specifically the BBD delay 54. In comparing this to the block diagram of FIG. 9, the distorted signal, that is, the output of the peak-limiting means 90, is coupled to the delay means 91. The implementation of FIG. 9 is not easily realized where a BBD delay is employed. The high frequency components introduced by the clipping cannot be delayed by a BBD because of the bandwidth limitations of a BBD. For this reason the undistorted signal (line 45) is first delayed and then passed through the clipper 58, which clipper, as mentioned, is identical to the clipper 46. In this manner, there is no need to delay the high frequency components. This is equivalent to first clipping the signal and then delaying it. The embodiment of FIG. 5 represents the present commercial embodiment; however, this embodiment is not the most economical means of providing the low frequency distortion cancellation.

It is apparent that by removing these low frequency components of the clipper-induced distortion, it slightly distorts the clipped peak levels of the output signal. To compensate for this, 1 to 2db of "headroom" must be added in System II. This is of no great significance since clipping of 10db is not uncommon in the clippers 4 and 58. This headroom is added through the attenuator 62.

In some unusual cases large amount of low frequency energy may be present in the distortion waveform on line 37. For this reason a safety clipper 66 is employed at the output of the system. To assure that the clipper 66 does not introduce noticeable distortion by its clipping, lowpass filter 34 is used in System III. In System II, lowpass filter 50 provides an identical function; thus the output of filter 50 may be substituted for the output of filter 34, and filter 34 omitted. The output of filter 50 in System II is an additional input to the ORing circuit 24. If the output of filter 50 (or filter 34 in System III) exceeds a predetermined level, thereby indicating there is a significant amount of low frequency energy in the distortion signal, an output is produced by ORing circuit 24. This, in turn, reduces the gain of VCA 3 and the level of clipping. Note that the output of filter 50 (or filter 34 in System III) may be employed to charge capacitor 30 by means of a separate threshold comparator and charging transistor where desired.

It is apparent that with System II the filters such as filters 8, 10, 12 and 14 which operate below 1.8 kHz in System I are not necessary. Only those filters which operate in the critical bands above 1.8 kHz are required. For System II the critical bands at 2, 2.5, 3.15, 4, 5 and 6 kHz may be employed.

The cost of System II may be reduced by employing a single octave-width bandpass filter for both the 5 and 6 kHz bands, or a single filter which also includes the 4 kHz band. Generally in any of the systems, filters in critical bands above 6 kHz are not required since typically 30db or more of attenuation occurs within the receiver in frequencies above 6 kHz. Moreover, since this frequency range is sufficiently removed from the ear's most sensitive frequency range (1–3 kHz), frequencies above 6 kHz are less important insofar as perceived distortion is concerned.

System II provides a substantial improvement in the overall quality of the sound perceived at the receiver. It is particularly successful in eliminating the characteristic "thickening" of vocal sibilance which is caused by extensive clipping.

System III includes the entire apparatus of FIGS. 1 and 2. In System III, System I is employed as a pilot system for providing a signal on line 36 which controls both the VCA 3 and the VCA 44. The removal of the low frequency components of the clipper-induced distortion, as performed by System II is included in System III.

As previously mentioned, in order to stabilize the feedback loop which includes the line 36, a relatively slow attack time in the order of milliseconds is necessary. While the pilot system of FIG. 1 is attacking, distortion perceived as "clicks" or "pops" are sometimes noticeable. To some extent, this is a problem with any feedback gain-control loop which is often solved by employing a feedforward circuit. For example, a delay line is coupled between the variable gain amplifier and the input audio signal such that the gain of the amplifier has settled to a steady state before the overload necessitating the gain reduction reaches the amplifier. However, with the presently described invention, a feedforward system with a finite number of elements cannot be employed since the distortion signal is non-linear with respect to the control signal on line 36. In System III a similar scheme to the feedforward circuit is employed to compensate for the slow attack time.

Referring to FIGS. 1 and 2, a second VCA 44 is used to control the amplitude of the audio signal while the VCA 3 is used only for the pilot system. The audio signal is delayed through the bucket-brigade device, delay means 38. As mentioned, the BBD delay means 38 comprises 512 stages which are clocked at 60 kHz to provide a delay of approximately 3.7 milliseconds. Since this delay is slightly longer than the attack time of the pilot system, the gain of VCA 44 is fully settled by the time that an overloading transient reaches the VCA 44. As was the case with the delay 54, a lowpass filter is employed at the output of the BBD delay means 38. A fourth order Chebychev filter with a 0.5 db bandpass ripple is employed for this purpose. The phase response associated with filter 40 is corrected by the delay equalizer 42. This equalizer comprises a second-order, allpass section which assures that the lowpass filtering process will not substantially distort its input waveform due to non-constant delay in the basic lowpass filter 40.

The output of the VCA 44 is clipped by clipper 46. This clipper has the same threshold as the clippers 4 and 58. It should be noted that the 10 millisecond hold on the control signal (line 36) caused by the release time circuit 32 assures that this control signal will not start to decay until after the transient has been clipped by clipper 46. However, because of the delay introduced by delay means 38 which allows VCA 44 to be settled in a steady state (i.e. with reduced gain), excessive clipping on attack transients by clipper 46 is avoided. The output of clipper 46 is differenced with the clipper's input to provide a distortion signal comparable to the signal on line 37. From this point forward, System III operates in an identical manner to System II.

It is apparent that an output audio signal may be obtained from the clipper 46 since this output is controlled by VCA 44. In this case the differential amplifier 48 and the remainder of the circuitry of FIG. 2 is not required. However, if this is done, the pilot system should operate over the full audible frequency band as it does for System I.

While the apparatus and method of the present invention is employed to maintain the clipper-induced distortion at a non-audible level, the apparatus and method may be employed to keep the distortion at a constant level, even where the distortion is audible in order to provide greater overall volume.

Thus, a peak-limiting apparatus and method have been described. The apparatus and method permits maximum possible loudness from a peak-limited channel without causing audible distortion. The apparatus and method estimates perceivable distortion by implementing, in circuit form, psychoacoustic masking curves.

I claim:

1. An apparatus for controlling peak levels of an input signal comprising:
   controllable clipping means for clipping said input signal, the amount of said clipping controlled by a control signal applied to said clipping means;
   distortion determining means for determining the amount of distortion introduced by said clipping means, said distortion determining means coupled to said clipping means;
   control means for generating said control signal, said control means coupled to said distortion means and coupled to receive said input signal;
   whereby peak levels of said input signal at the output of said clipping means are controlled by controlling the amount of said clipping.

2. The apparatus defined by claim 1 wherein said control means includes circuit means for evaluating the frequency content of said input signal and the frequency content of the distortion introduced by said clipping means, and for comparing said frequency contents.

3. The apparatus defined by claim 1 wherein said clipping means comprises a clipper and a voltage controlled amplifier said control signal coupled to said amplifier, the output of said amplifier coupled to the input of said clipper, and to said distortion determining means such that said amount of said clipping is controlled by varying the magnitude of said input signal before it is coupled to said clipper.

4. An apparatus for controlling peak levels of an input signal comprising:
   a variable-gain amplifier means for controlling the gain of a signal in response to a control signal, said amplifier means coupled to receive said input signal;
   a clipping means for clipping a signal, said clipping means coupled to the output of said amplifier means;
   a distortion determining means for determining the distortion caused by said clipping means, said distortion means coupled to the output of said clipping means, and coupled to said output of said amplifier means; and,
   a control signal generation means for providing said control signal for said variable-gain amplifier, said control signal generation means receiving an input from said distortion means and coupled to receive said input signal;
   whereby the peak levels of said input signal at said output of said clipping means are controlled.

5. The apparatus defined by claim 4 wherein said distortion determining means includes a differencing means for taking the difference of two signals, one input to said differencing means coupled to receive said output of said clipping means, the other input coupled to said output of said amplifier means.

6. The apparatus defined by claim 4 wherein said control means includes circuit means for evaluating the frequency content of said input signal and the frequency content of the distortion introduced by said clipping means and for comparing said frequency contents.

7. The apparatus defined by claim 6 wherein said frequency contents of said input signal and said distortion introduced by said clipping means are examined in a plurality of predetermined frequency bands by said circuit means.

8. The apparatus defined by claim 7 wherein said circuit means for said examination in said plurality of predetermined frequency bands includes a plurality of first filters coupled to receive said input signal and a plurality of second filters coupled to receive the output of said distortion determining means.

9. The apparatus defined by claim 8 wherein the characteristic of at least one of said plurality of first filters approximate a psychoacoustic masking curve.

10. An apparatus for controlling the peak levels of an input signal comprising:
   a variable gain amplifier coupled to receive said input signal for controlling the gain of said input signal in response to a control signal;
   a clipper coupled to the output of said variable gain amplifier;
   a differencing means, one input of said differencing means coupled to the output of said clipper and the other input of said differencing means coupled to receive said output of said amplifier;

a comparison means coupled to said differencing means and coupled to receive said input signal for comparing the output signal of said differencing means with said input signal and for providing said control signal for said variable gain amplifier;

whereby the peak levels of said input signal at said output of said clipper are controlled.

11. The apparatus defined by claim 10 including an integrator coupled between said comparison means and said variable gain amplifier.

12. An apparatus for peak-limiting an audio frequency signal comprising:

a variable gain amplifier for receiving said audio signal;

a clipper coupled to the output of said amplifier;

a differencing means for taking the difference of two signals, said differencing means having one of its input terminals coupled to the output of said clipper and the other of its input terminals coupled to said output of said amplifier;

a plurality of first bandpass filters coupled to receive said audio signal, a plurality of second bandpass filters coupled to the output of said differencing means;

a comparison means coupled to receive output signals from said plurality of first and second filters for comparing signal levels from said first filters with signals from said second filters;

threshold means for providing an output signal when input signals to said threshold means exceed a predetermined level, said threshold means coupled to receive outputs from said comparison means, said threshold means coupled to said variable gain amplifier for providing a control signal for said amplifier;

whereby the clipping performed by said clipper may be controlled to provide a peak-limited audio signal at said output of said clipper.

13. The apparatus defined by claim 12 wherein the characteristics of each of said filters of said plurality of said first filters approximates a psychoacoustic masking curve for a different predetermined frequency band.

14. The apparatus defined by claim 12 wherein said comparison means includes a plurality of peak detectors each for receiving an output signal from a different one of said plurality of first filters, each of said peak detectors coupled to a different one of a plurality of dividers, each of said dividers coupled to receive an output from a different one of said plurality of said second filters.

15. An apparatus for controlling peak levels of an input signal comprising:

clipping means for clipping said input signal;

distortion determining means coupled to receive the output of said clipping means and said input signal for determining the amount of distortion caused by said clipping;

a plurality of first filters coupled to receive said input signal;

a plurality of second filters coupled to said distortion means;

comparison means for comparing output signals from said plurality of first and second filters, said comparison means coupled to said filters, said comparison means providing a control signal coupled to said clipping means for controlling said clipping;

whereby peak levels of said input signal at the output of said clipping means are controlled.

16. The apparatus defined by claim 15 wherein the characteristics of at least one of said first filters approximate a psychoacoustic masking curve.

17. A method for controlling distortion in a clipped audio signal comprising the steps of:

clipping said audio signal;

determining the distortion of said audio signal caused by said clipping;

comparing said determined distortion with said audio signal; and controlling the amount of said clipping to maintain said distortion at a constant level based on said comparison of said determined distortion with said audio signal.

18. In the processing of an audio signal where distortion is introduced by a distortion causing means such as a clipper, a circuit for cancelling distortion in a predetermined frequency band comprising:

distortion determining means for determining said distortion, said distortion means coupled to receive said audio signal and distorted audio signal;

a filter coupled to said distortion means for passing said distortion;

delay means for delaying said distorted signal, said delay means for providing a delay approximately equal to the delay of said filter, said delay means coupled to receive said distorted signal;

removal means for removing said distortion, coupled to said filter and to said delay means;

whereby said distortion in said predetermined frequency band is cancelled.

19. The circuit defined by claim 18 wherein said filter is a lowpass filter.

20. The circuit defined by claim 19 including a correction means for correcting for said delay caused by said delay means to provide a uniform delay, said correction means coupled to pass said audio signal.

21. The circuit defined by claim 20 wherein said delay means includes a second lowpass filter.

22. The circuit defined by claim 19 including a first shelving filter coupled to filter said audio signal before said audio signal is coupled to said distortion causing means.

23. The circuit defined by claim 22 including a second shelving filter having complementary characteristics to said first shelving filter coupled in series with said delay means.

24. The circuit defined by claim 18 wherein said distortion means comprises a differential amplifier.

25. In the processing of an audio signal where distortion is introduced by a distortion-causing means such as a clipper, a circuit for cancelling distortion comprising:

distortion determining means for determining said distortion, said distortion means coupled to receive said audio signal and distorted audio signal;

a filter coupled to said distortion determining means for passing said distortion;

removal means for removing said distortion, coupled to said filter and coupled to receive said distorted audio signal;

whereby said distortion is cancelled.

26. The circuit defined by claim 25 including a delay means for delaying said distorted audio signal, said delay means for providing a delay approximately equal to the delay of said filter, said delay means coupled between said distortion-causing means and said removal means.

27. An apparatus for controlling the peak levels of an input signal comprising:
- a first variable gain amplifier coupled to receive said input signal for controlling the gain of said input signal in response to a control signal;
- a first clipper coupled to the output of said variable gain amplifier;
- a differencing means for taking the difference between two signals, one input of said differencing means coupled to the output of said clipper and the other input of said differencing means coupled to receive said output of said first amplifier;
- a comparison means coupled to said differencing means and coupled to receive said input signal for comparing the output signal of said differencing means with said input signal and for providing said control signal for said first variable gain amplifier;
- a delay means, coupled to receive said input signal for delaying said input signal;
- a second variable gain amplifier for controlling the gain of a signal, said second amplifier coupled to receive the output of said delay means and coupled to said comparison means to receive said control signal;
- a second clipper coupled to the output of said second amplifier;
- distortion determining means for determining the amount of distortion introduced by said second clipper, said distortion determining means coupled to receive said output of said second amplifier and the output of said second clipper;
- a lowpass filter coupled to the output of said distortion determining means;
- a third clipper coupled to said output of said second amplifier;
- a combining means for combining signals coupled to receive the output of said lowpass filter and the output of said third clipper;
- whereby, at the output of said combining means, peak levels of said input signal are controlled and low frequency distortion is reduced.

28. The apparatus defined by claim 27 including a second delay means for delaying a signal coupled between said output of said second amplifier and said third clipper.

29. An apparatus for controlling the peak levels of an input signal comprising:
- a first variable gain amplifier coupled to receive said input signal for controlling the gain of said input signal in response to a control signal;
- a first clipper coupled to the output of said variable gain amplifier;
- a differencing means for taking the difference between two signals, one input of said differencing means coupled to the output of said clipper and the other input of said differencing means coupled to receive said output of said first amplifier;
- a comparison means coupled to said differencing means and coupled to receive said input signal for comparing the output signal of said differencing means with said input signal and for providing said control signal for said first variable gain amplifier;
- a delay means, coupled to receive said output of said first amplifier for delaying said output of said first amplifier;
- a second clipper coupled to the output of said delay means;
- a lowpass filter coupled to the output of said differencing means;
- a combining means for combining signals coupled to receive the output of said filter and the output of said second clipper;
- whereby at the output of said combining means, peak levels of said input signals are controlled and low frequency distortion is reduced.

* * * * *